(12) United States Patent
Weaver et al.

(10) Patent No.: US 7,928,561 B2
(45) Date of Patent: Apr. 19, 2011

(54) DEVICE FOR THERMAL TRANSFER AND POWER GENERATION

(75) Inventors: Stanton Earl Weaver, Northville, NY (US); Mehmet Arik, Niskayuna, NY (US)

(73) Assignee: General Electric Company, Nishayuna, NY (US)

( * ) Notice: Subject to any disclaimer, the term of this patent is extended or adjusted under 35 U.S.C. 154(b) by 275 days.

(21) Appl. No.: 11/449,002

(22) Filed: Jun. 7, 2006

(65) Prior Publication Data

US 2007/0069357 A1    Mar. 29, 2007

Related U.S. Application Data (60) Provisional application No. 60/715,797, filed on Sep. 9, 2005.

(51) Int. Cl.
*H01L 23/34* (2006.01)
(52) U.S. Cl. ...... 257/712; 257/25; 257/30; 257/E29.168
(58) Field of Classification Search .................. 257/104, 257/712, 25, 30, E29.168; 136/203, 205
See application file for complete search history.

(56) References Cited

U.S. PATENT DOCUMENTS

| | | | |
|---|---|---|---|
| 3,169,200 A | 2/1965 | Huffman | |
| 4,281,280 A * | 7/1981 | Richards | 322/2 R |
| 5,760,417 A * | 6/1998 | Watanabe et al. | 257/11 |
| 5,921,087 A | 7/1999 | Bhatia et al. | |
| 5,932,254 A * | 8/1999 | Mitchell et al. | 425/117 |
| 6,535,388 B1 * | 3/2003 | Garcia | 361/704 |
| 6,809,417 B1 | 10/2004 | Rossetti | |
| 6,876,123 B2 | 4/2005 | Martinovsky et al. | |
| 7,327,026 B2 * | 2/2008 | Shimogishi et al. | 257/712 |
| 2004/0050415 A1 * | 3/2004 | Kucherov et al. | 136/252 |
| 2004/0189141 A1 | 9/2004 | Tavkhelidze et al. | |
| 2005/0016575 A1 | 1/2005 | Kumar et al. | |
| 2005/0110099 A1 * | 5/2005 | Shimogishi et al. | 257/378 |
| 2006/0162761 A1 | 7/2006 | Tanielian | |
| 2007/0023077 A1 | 2/2007 | Tanielian | |

OTHER PUBLICATIONS

Definition of "abut" as cited on Dictionary.com, refrenced to the Random House Dictionary.*
Definition of "adjacent" as cited on Dictionary.com, referenced to the Random House Dictionary.*
Hishinuma et al., "Measurements of cooling by room-temperature thermionic emission across a nanometer gap", J. Appl. Phys., vol. 94, No. 7, Oct. 1, 2003, pp. 4690-4696.
Ronggui Yang, Arvind Narayanaswamy, and Gang Chen; "Surface-Plasmon Coupled Nonequilibrium Thermoelectric Refrigerators and Power Generators", Journal of Computational and Theoretical Nanoscience, vol. 2, No. 1, pp. 75-87, 2005. 14Pages.

* cited by examiner

*Primary Examiner* — Thao X Le
*Assistant Examiner* — Robert Huber
(74) *Attorney, Agent, or Firm* — Patrick K. Patnode (57) ABSTRACT

A system is provided. The system includes a device that includes top and bottom thermally conductive substrates positioned opposite to one another, wherein a top surface of the bottom thermally conductive substrate is substantially atomically flat and a thermal blocking layer disposed between the top and bottom thermally conductive substrates. The device also includes top and bottom electrodes separated from one another between the top and bottom thermally conductive substrates to define a tunneling path, wherein the top electrode is disposed on the thermal blocking layer and the bottom electrode is disposed on the bottom thermally conductive substrate.

22 Claims, 10 Drawing Sheets

DEVICE FOR THERMAL TRANSFER AND POWER GENERATION

CROSS REFERENCE TO RELATED APPLICATIONS

This application claims priority to U.S. Provisional Application No. 60/715,797, filed on Sep. 9, 2005.

STATEMENT REGARDING FEDERALLY SPONSORED RESEARCH & DEVELOPMENT

This invention was made with Government support under contract number DE-FC26-04NT42324 awarded by the U.S. Department of Energy. The Government has certain rights in the invention.

BACKGROUND

The invention relates generally to thermal transfer devices, and particularly, to solid-state thermal transfer devices.

Thermal transfer devices may be used for a variety of heating/cooling systems, such as refrigeration, air conditioning, electronics cooling, industrial temperature control, heat recovery, and power generation systems. These thermal transfer devices are also scalable to meet the thermal management needs of a particular system and environment. Unfortunately, existing thermal transfer devices, such as those relying on refrigeration cycles, are relatively inefficient and environmentally unfriendly due to mechanical components such as compressors and the use of refrigerants.

Accordingly, needs exist for providing a thermal transfer device that has higher efficiencies, higher cooling density, higher reliability, reduced size and weight, reduced noise, and are more environmentally friendly.

BRIEF DESCRIPTION

In accordance with certain embodiments, a system is provided. The system includes a device that includes top and bottom thermally conductive substrates positioned opposite to one another, wherein a top surface of the bottom thermally conductive substrate is substantially atomically flat and a thermal blocking layer disposed adjacent the top thermally conductive substrate between the top and bottom thermally conductive substrates. The device also includes top and bottom electrodes separated from one another between the top and bottom thermally conductive substrates to define a tunneling path, wherein the top electrode is disposed on the thermal blocking layer and the bottom electrode is disposed on the bottom thermally conductive substrate.

In accordance with certain embodiments, a device is provided. The device includes a first tunneling electrode disposed on a substrate and a thermal backpath resistant layer disposed adjacent the first tunneling electrode, wherein the thermal backpath resistant layer comprises one or more vias. The device also includes a second tunneling electrode disposed on the thermal backpath resistant layer, wherein the second tunneling electrode comprises a patterned metal layer, and metal extends through the one or more vias.

In accordance with certain embodiments, a method is provided. The method includes passing hot electrons across a thermotunneling gap between first and second thermally conductive substrates, wherein the thermotunneling gap is defined by first and second electrodes disposed between the first and second substrates and reducing a thermal backpath between the first and second substrates through an integral thermal blocking layer disposed adjacent the first electrode, or the second electrode between the first and second substrates.

In accordance with certain embodiments, a method is provided. The method includes providing first and second thermally conductive substrates wherein, the first, second, or both substrates have a substantially atomically flat substrate on a surface between the first and second substrates and disposing a thermal blocking layer adjacent the first thermally conductive substrate between the first and second thermally conductive substrates to substantially reduce the thermal backpath in the device. The method also includes disposing a first electrode on the thermal blocking layer and a second electrode on the second thermally conductive substrate to define a tunneling path between the first and second electrodes

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
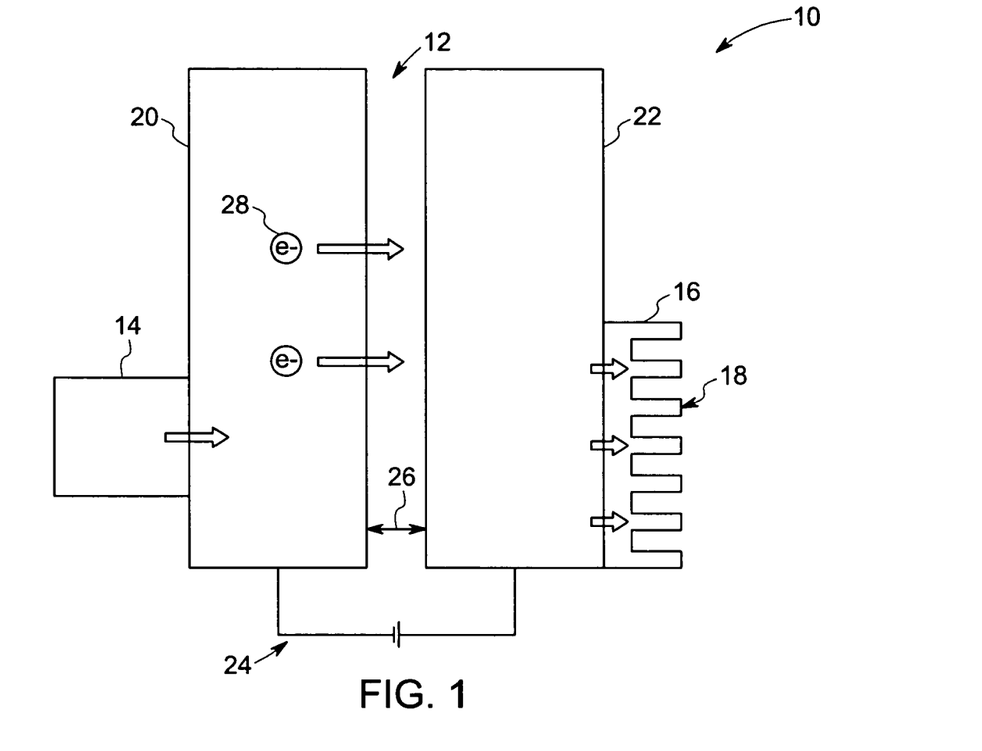
FIG. 1 is a diagrammatical illustration of a system having a thermal transfer device in accordance with an embodiment of the present technique.

Referring now to the drawings, FIG. 1 illustrates a system 10 having a thermotunneling-based thermal transfer device, hereinafter thermotunneling device 12 in accordance with certain embodiments of the present technique. As illustrated, the system 10 includes the thermotunneling device 12 that transfers heat from an area or object 14 to another area or object, such as a heat sink 16, which heat sink 16 then dissipates the heat via fins 18. Although heat sink 16 is illustrated on a hot side in this exemplary system 10, it might be used on either sides of the system 10. More specifically, the thermotunneling device 12 comprises a first electrode 20 thermally coupled to the object 14 and a second electrode 22 that is thermally coupled to the heat sink 16. Further, an input voltage source 24 is coupled to the first electrode 20 and the second electrode 22, which electrodes 20 and 22 are separated by a thermotunneling gap 26. In operation, the input voltage source 24 provides a flow of current through the first and second electrodes 20 and 22, thereby creating a tunneling flow of hot electrons 28 between the electrodes 20 and 22 across the thermotunneling gap 26. In this embodiment, the flow of current via the input voltage source 24 enables hot electrons 28 to leave their orbit and tunnel across the thermotunneling gap 26, thus transporting heat. As a result of this tunneling flow of hot electrons 28, the thermotunneling device 12 facilitates heat transfer away from the object 14 towards the heat sink 16. At the heat sink 16, the fins 18 facilitate heat transfer away from the system 10.

The heat transfer path after tunneling of electrons 28 through the thermotunneling device 12 consists of a forward path that is heat removal to ambient and a back path that causes heat to travel back to the electrode 20. As discussed in detail below, the system 10 may include one or more thermal blocking layers, structures, or members configured to substantially reduce the thermal backpath in the thermotunneling device 12. The system 10 also may include structures such as one or more vias, slots, grooves, channels, or trenches configured to provide electrical feed throughs or selective thermal paths In one embodiment, the thermotunneling gap 26 may be formed by vacuum that provides a very low thermal back path to enhance the efficiency of the thermotunneling device 12. In certain embodiments, the thermotunneling gap 26 has a spacing ranging between approximately 1 nanometer to about 20 nanometers. In one exemplary embodiment, the thermotunneling gap 26 has a spacing ranging between approximately 4 nanometers to about 10 nanometers. The nanometer gap between the first and second electrodes 20 and 22 facilitates a substantial reduction in the tunneling of cold electrons across the thermotunneling gap and facilitates a substantial increase in the tunneling of hot electrons across the thermotunneling gap 26. Further, the nanometer gap between the first and second electrodes 20 and 22 advantageously reduces an otherwise high voltage requirement across the first and second electrodes 20 and 22 for facilitating the tunneling of electrons. Thus, a nanometer gap between the first and second electrodes 20 and 22 enables the tunneling of electrons at a lower voltage, thereby enhancing the efficiency of the thermotunneling device 12. In certain embodiments, application of low work function materials such as alkali metals on the electrodes 20 and 22 further enhances efficiency.

The nanometer spacing and application of a bias voltage across the thermotunneling gap 26 facilitate a substantially unidirectional heat flow across the thermotunneling gap 26. In the illustrated embodiment, the heat flow is unidirectional from the object 14 towards the heat sink 16, thus making the object 14 cooler by transferring the heat to the heat sink 16. In certain embodiments, the thermotunneling device 12 may facilitate the heating or cooling of a closed environment. It should be noted that the thermotunneling device 12 may be operable at or near room temperature. In certain embodiments, the first and second electrodes 20 and 22 comprise dissimilar materials that enhance the tunneling of electrons because of a peltier effect, thereby enhancing the efficiency of the thermotunneling device 12. However, the direction of current flow may be selected based upon a desired direction of the thermotunneling of electrons between the first and second electrodes 20 and 22 as described below with reference to FIGS. 2 and 3.

Figure 2:
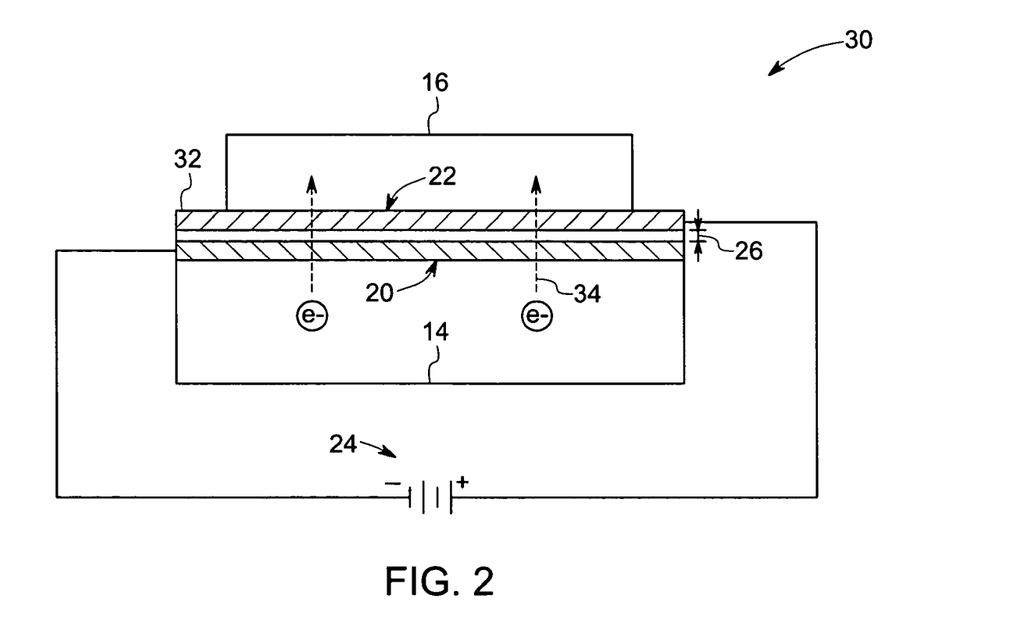
FIG. 2 is a diagrammatical illustration of a cooling system having a thermal transfer device in accordance with an embodiment of the present technique.

FIG. 2 illustrates a cooling system 30 having a thermal transfer device, such as a thermotunneling device 32, in accordance with embodiments of the present technique. The thermotunneling device 32 comprises the first electrode 20 and the second electrode 22 separated by the thermotunneling gap 26. As illustrated, the first electrode 20 is thermally coupled to the object/area 14 and the second electrode 22 is thermally coupled to the object/area 16. Further, the first electrode 20 and the second electrode 22 are coupled to the input voltage source 24 with the polarity as shown in FIG. 2. In operation, the input voltage source 24 activates the thermotunneling device 32 at a determined tunneling current. As the current flows from the second electrode 22 to the first electrode 20, the thermotunneling device 32 forces electrons to move from the object 14 toward the object 16 in a direction 34 over the thermotunneling gap 26. The movement of electrons in the direction 34 transfers heat away from the object 14, across the gap 26, and into the object 16, wherein the heat is further transferred away from the system 30. Advantageously, this thermotunneling-based heat transfer cools the object 14.

Figure 3:
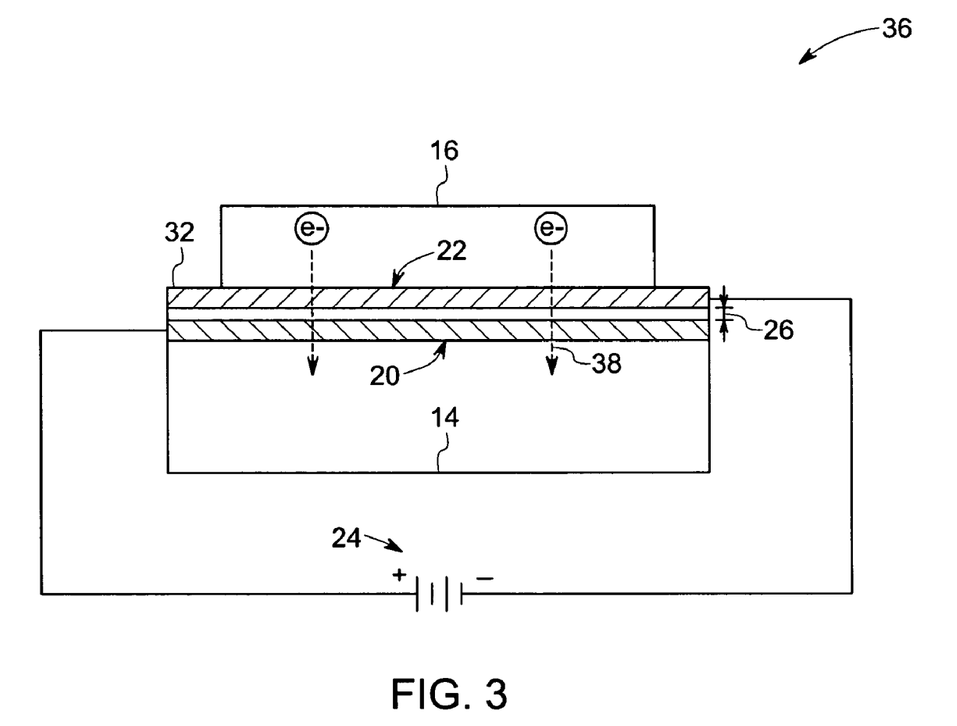
FIG. 3 is a diagrammatical illustration of a heating system having a thermal transfer device in accordance with an embodiment of the present technique.

FIG. 3 illustrates a heating system 36 having the thermotunneling device 32 in accordance with embodiments of the present technique. As described above, the thermotunneling device 32 includes the two electrodes 20 and 22 that are thermally coupled to the objects 14 and 16, respectively. In addition, the thermotunneling device 32 is coupled to the input voltage source 24. As illustrated, the polarity of the input voltage source 24 in the heating system 36 is reversed as compared to the cooling system 30 as shown in FIG. 2. This enables the electrons to flow from the object 16 to the object 14 in a direction 38, thus heating the object 14 by transferring heat from the object 16 to the object 14. As described above, the thermotunneling device 32 may be employed for heating or cooling of objects 14 and 16. In certain embodiments, the thermotunneling device 32 may be employed for power generation by maintaining a temperature gradient between the first and second objects 14 and 16, respectively. Thus, based upon a direction of flow of current between the electrodes 20 and 22, the thermotunneling device 32 facilitates heating or cooling of the objects 14 and 16.

The heat transfer path resulting from the tunneling of the electrons in the thermotunneling device 12 (see FIG. 1) described above includes a forward path where the heat is removed to the ambient and a back path that causes the heat to travel back towards the electrodes 20. In the illustrated embodiment, the thermotunneling device 12 functions to substantially reduce the thermal back path losses in the device 12, thereby enhancing the efficiency of the device 12. In one embodiment, the thermotunneling device 12 includes an integral thermal blocking layer for reducing the thermal back path losses and may be fabricated by a variety of techniques, such as the exemplary techniques described in detail below with reference to FIGS. 4, 5 and 6.

Figure 4:
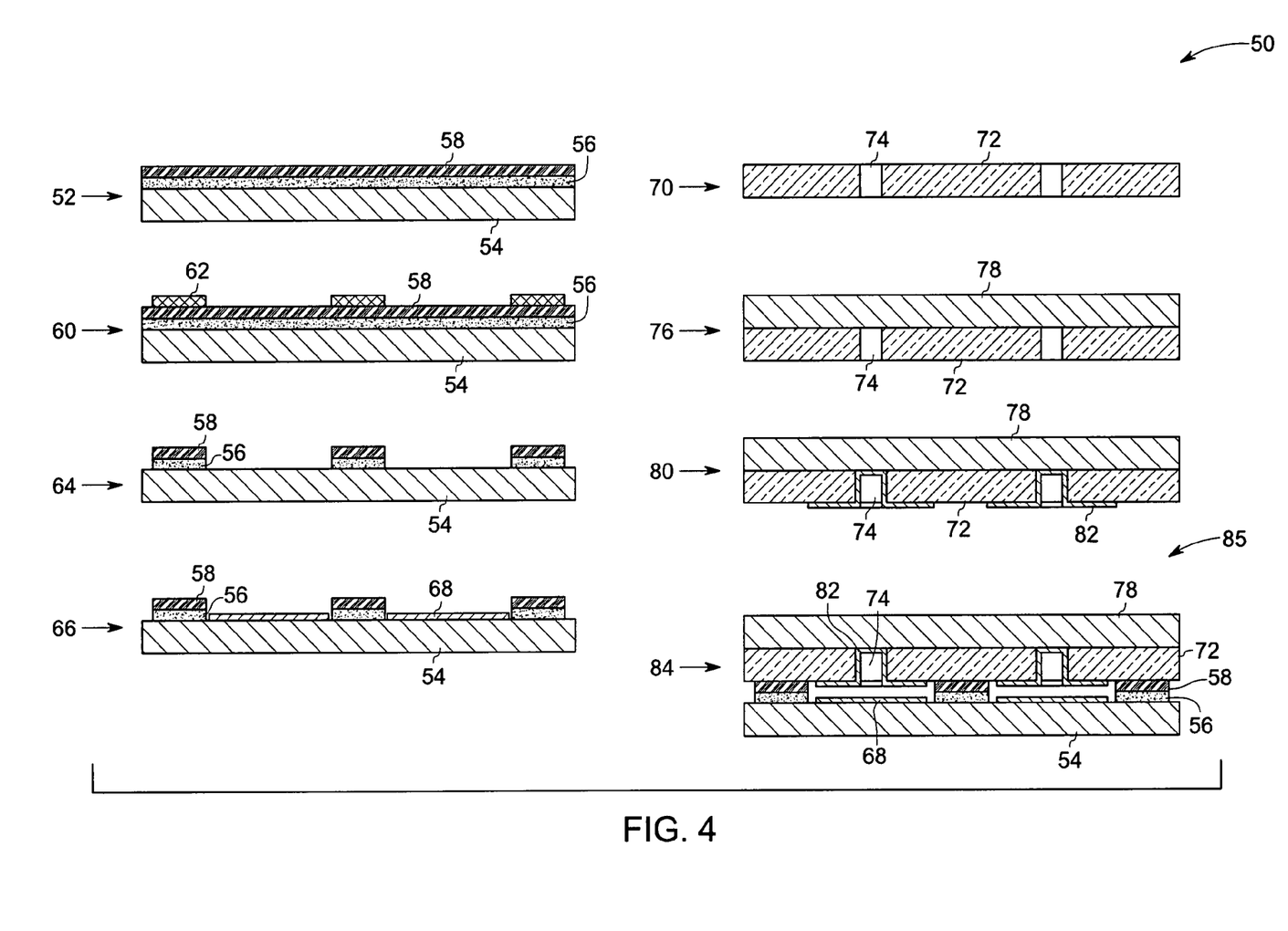
FIG. 4 is a diagrammatical illustration of an exemplary process of manufacturing the thermal transfer device employed in the system of FIG. 1 in accordance with an embodiment of the present technique.

FIG. 4 is a diagrammatical illustration of an exemplary process 50 of manufacturing the thermal transfer device 12 employed in the system of FIG. 1. As represented by reference numeral 52, the process begins with providing a bottom thermally conductive substrate 54 that is substantially atomically flat. The use of top, bottom, above, below and variations of these terms is made for convenience to describe interrelationships between components, but does not require any particular orientation of the overall structure or assembly. The surface of the bottom thermally conductive substrate 54 is substantially flat to an atomic level. Advantageously, this substantially atomically flat characteristic of the substrate results in a relatively low emissivity and surface roughness. As used herein, the term "emissivity" refers to the ratio of energy emitted by an object to the energy emitted by a blackbody at the same temperature. In certain embodiments, the emissivity of the thermally conductive substrate 54 is less than about 0.05. For example, highly doped n-type silicon wafer may be used for the thermally conductive substrate 54. Alternatively, highly doped p-type silicon wafer may be used for the thermally conductive substrate 54. Further, an electrical barrier layer 56 is disposed on the thermally conductive substrate 54 to provide a tunneling barrier for the flow of electrons in the thermal transfer device 12. In certain embodiments, the electrical barrier layer 56 may be grown or deposited on the thermally conductive substrate 54 by techniques such as thermal oxidation, chemical vapor deposition, enhanced plasma assisted chemical vapor deposition, sputtering, evaporation or spin coating. Examples of the electrical barrier layer 56 include an oxide, or a nitride, or a silica-based aerogel, or porous silicon, or glass, or a polymer, or a combination thereof.

In addition, a wafer bondable layer 58 is disposed on the electrical barrier layer 56. In this exemplary embodiment, the wafer bondable layer 58 includes a polysilicon layer 58 disposed on the electrical barrier layer 56. In certain embodiments, the wafer bondable layer 58 includes a diffusible bonding layer, or a direct bondable metal layer, or a solderable layer, or a eutectic layer disposed on the electrical barrier layer 56. Examples of diffusible bonding layer include polysilicon, or oxide, or silicon, or any combinations thereof. Examples of direct bondable metal layer include copper, or gold, or any combinations thereof. Examples of a solderable layer or a eutectic layer include gold, or silicon, or tin, or any combinations thereof. Further, as represented by reference numerals 60 and 64, a pattern photoresist 62 is employed to pattern the electrical barrier and the polysilicon layers 56 and 58 on the thermally conductive substrate 54. In addition, as represented by reference numeral 66, a metal layer is disposed on the thermally conductive substrate 54 and is patterned to form the bottom electrode 68, which is in ohmic contact with the substrate.

Further, as represented by reference numeral 70, a thermal blocking wafer 72 having one or more vias 74 is provided. In one embodiment, the vias 74 may be coated or filled with metal depending upon the desired tunneling current of the device and a desired efficiency. In this embodiment, the thermal blocking wafer 72 forms an integral thermal blocking layer or thermal backpath resistant layer that is configured to substantially reduce the thermal backpath losses in the thermal transfer device 12. Examples of the thermal blocking layer 72 include glass, or silicon dioxide, or sapphire, or silicon carbide, or a combination thereof. In this exemplary embodiment, the thermal blocking layer 72 includes borosilicate glass, such as PYREX. It should be noted that PYREX has a low thermal conductivity of about 1 W/m-K and has a coefficient of thermal expansion (CTE) that is substantially equivalent to the CTE of the electrode materials employed in the device. Furthermore, the material of the thermal blocking layer 72 is selected such that the thermal blocking layer 72 is easily bondable to substrate 54, the patterned electrical barrier layer 56 or the wafer bondable layer 58 based upon a selected configuration of the thermal transfer device 12. Additionally when the thermal blocking layer 72 is not easily bondable to the substrate 54, the patterned electrical barrier layer 56, or the wafer bondable layer 58, an additional bondable layer may be deposited onto the thermal blocking layer 72 and patterned to align with the bondable layer 58. Further, as represented by reference numeral 76 the thermal blocking layer 72 is bonded to a top thermally conductive substrate 78. In one exemplary embodiment, the thermal blocking layer 72 is bonded to the top thermally conductive substrate 78 via an anodic bond. However, other bonding techniques may be employed. In the illustrated embodiment, the top thermally conductive substrate 78 includes a substantially flat substrate. As with thermally conductive substrate 54, a highly doped n-type silicon wafer, or a highly doped p-type silicon wafer may be employed as the top thermally conductive substrate 78.

Further, as represented by reference numeral 80, a patterned metal layer 82 is disposed on the thermally conductive substrate 78 to form the top electrode. In the illustrated embodiment, the metal layer 82 extends within the one or more vias 74 to provide the electrical feed through the thermal blocking layer 72 between the top electrode 82 and the top thermally conductive substrate 78. Next, the top structure formed represented formed at step 80 is bonded with the bottom structure formed at step 66 to form assembled thermal transfer device, as represented by reference numeral 84. In particular, the thermal blocking layer 72 is bonded to the polysilicon layer 58 via diffusion bonding to form assembled thermotunneling-based thermal transfer device 85. However, other types of bonding techniques may be envisaged. It should be noted that the tunneling of electrons between the top and bottom electrodes 82 and 68 facilitates the heat transfer between the top and bottom electrodes 82 and 68. In certain embodiments, a reflective coating may be disposed on the top and bottom electrodes 82 and 68 for reducing the radiation losses in the thermal transfer device 85. Further, the integral thermal blocking layer 72 substantially reduces the thermal backpath losses, thereby enhancing the efficiency of the thermal transfer device 85.

In certain embodiments, the top and bottom thermally conductive substrates 78 and 54 are placed inside a vacuum chamber and are bonded at a desired temperature, thus forming a vacuum within the thermotunneling gap to enhance the efficiency of the thermal transfer device 85. Alternatively, the bonding of the top and bottom thermally conductive substrates 78 and 54 may be performed in an inert gas environment, thus filling the thermotunneling gap with an inert gas such as xenon. The top and bottom thermally conductive substrates 78 and 54 may be bonded in a configuration in which the top and bottom thermally conductive substrates 78 and 54 are positioned opposite from one another. In one embodiment, reference marks are provided on each of the top and bottom thermally conductive substrates 78 and 54 that are employed by wafer bonder alignment optics to facilitate control of alignment of the top and bottom thermally conductive substrates 78 and 54. The thermal blocking layer 72 described above enhances the thermal resistance of the device thereby reducing the thermal back path and enhancing the device efficiency.

Figure 5:
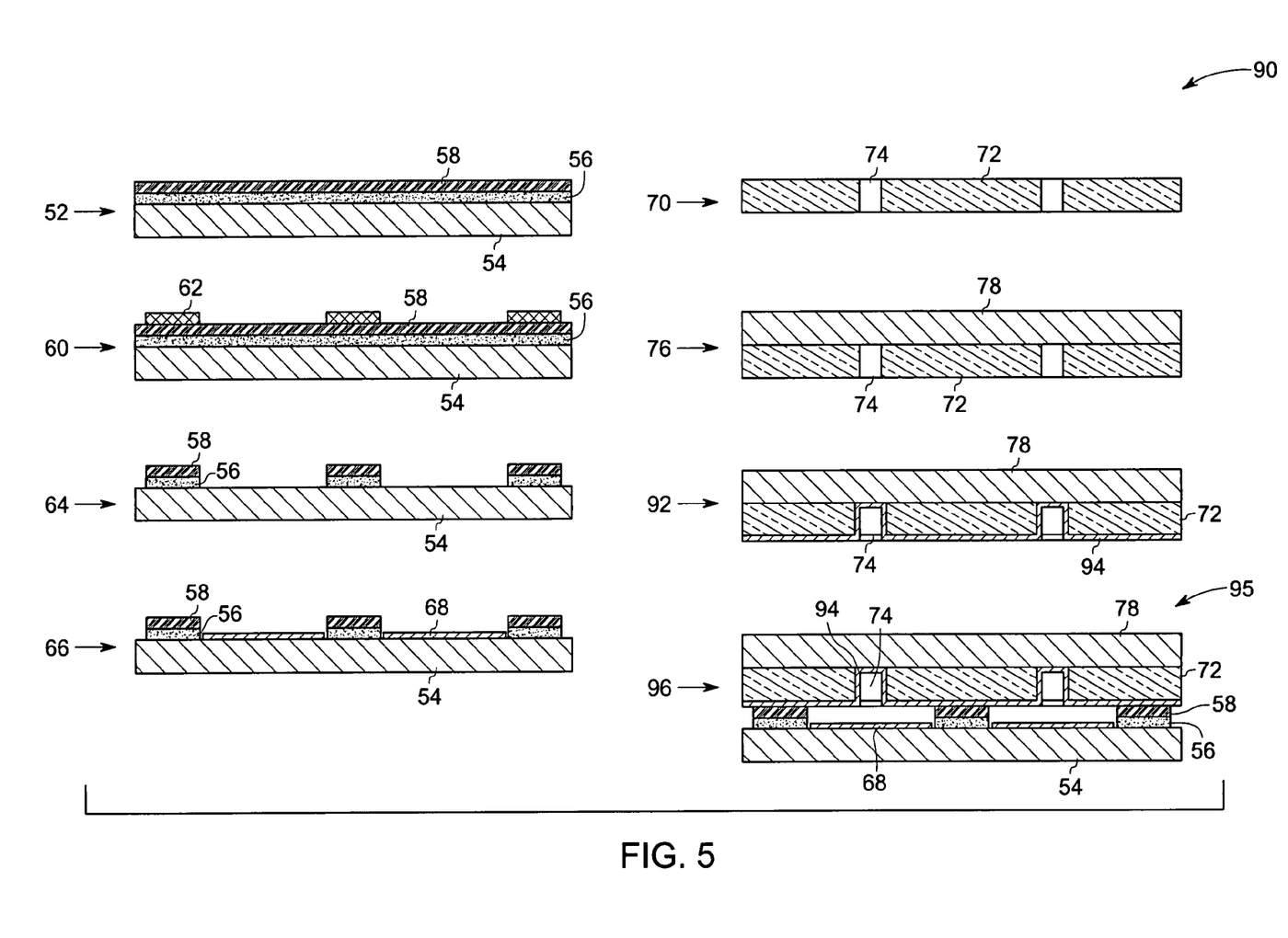
FIG. 5 is a diagrammatical illustration of another exemplary process of manufacturing the thermal transfer device employed in the system of FIG. 1 in accordance with another embodiment of the present technique.

FIG. 5 is a diagrammatical illustration of another exemplary process 90 of manufacturing the thermal transfer device 12 employed in the system of FIG. 1 in accordance with another embodiment of the present technique. The exemplary process 90 includes the process steps represented by reference numerals 52, 60, 64, 66, 70, and 76 as described above with reference to FIG. 4. However, in contrast to the embodiment of FIG. 4, the embodiment of FIG. 5 includes process steps represented by reference numerals 92 and 96 rather than steps represented by reference numerals 80 and 84. In this exemplary embodiment, a top electrode 94 is formed by blanket metallization of the front surface of the thermal blocking layer 72, as represented by step 92. Advantageously, the blanket metallization technique may reduce cost by eliminating resist coat, expose, develop, etch and resist strip. Further, the thermal blocking layer 72 is bonded to the polysilicon layer 58 via a eutectic bond to form a thermal transfer device 95, as represented by reference numeral 96. Again, the bonding may be performed in vacuum or in an inert gas environment to enhance the efficiency of the thermal transfer device 95.

Figure 6:
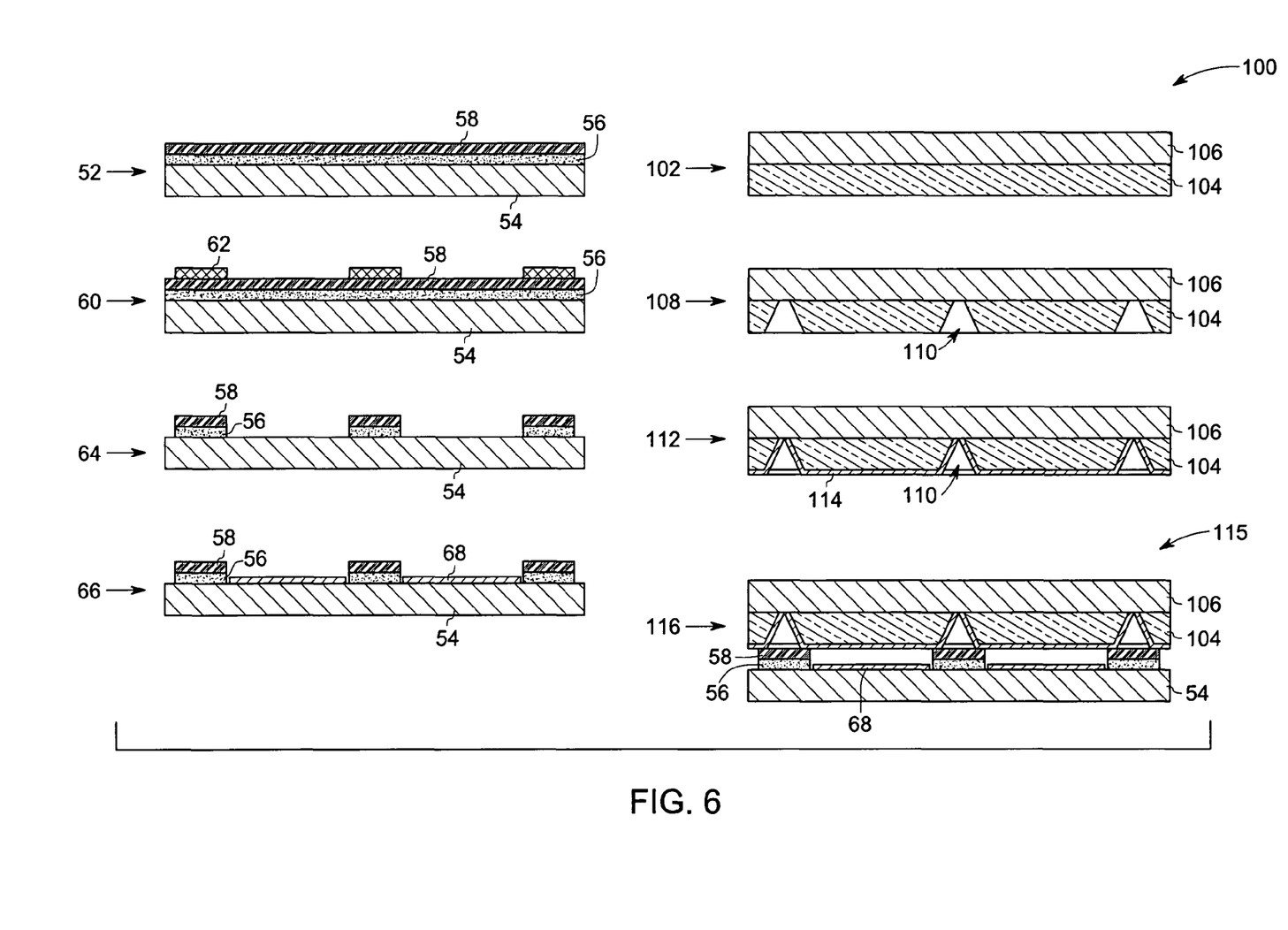
FIG. 6 is a diagrammatical illustration of another exemplary process of manufacturing the thermal transfer device employed in the system of FIG. 1 in accordance with another embodiment of the present technique.

FIG. 6 is a diagrammatical illustration of another exemplary process 100 of manufacturing the thermal transfer device 12 employed in the system of FIG. 1 in accordance with another embodiment of the present technique. The exemplary process 100 includes the process steps represented by reference numerals 52, 60, 64, and 66 as described above with reference to FIG. 4. However, in contrast to the embodiment of FIG. 4, the embodiment of FIG. 6 includes process steps represented by reference numerals 102, 108, 112, and 116 rather than steps represented by reference numerals 70, 76, 80, and 84. As represented by reference numeral 102, a thermal blocking layer 104 is bonded to a top thermally conductive substrate 106 via an anodic bond. However, other bonding techniques may be employed. Further, as represented by reference numeral 108, the thermal blocking layer 104 is patterned and wet etched to form one or more vias 110. It should be noted that placing the vias 110 in the bonding area increases the available tunneling area per electrode thereby increasing cooling per unit area of such thermal transfer devices 12. Further, it also eliminates any non planarity in the electrode tunneling area that may be caused by the via formation and metallization steps. In the illustrated embodiment, the vias 110 include angled vias. In an alternate embodiment, the vias 110 include straight vias. However, other shapes of vias 110 may be envisaged.

As represented by reference numeral 112, a front surface 114 of the thermal blocking layer 104 is metallized to form the top electrode. Further, the thermal blocking layer 104 is bonded to the polysilicon layer 58 via eutectic bond to form a thermal transfer device 115, as represented by reference numeral 116. Again, the bonding of the top and bottom thermally conductive substrates 106 and 54 may be performed in vacuum or in an inert gas environment to enhance the efficiency of the thermal transfer device 115.

Figure 7:
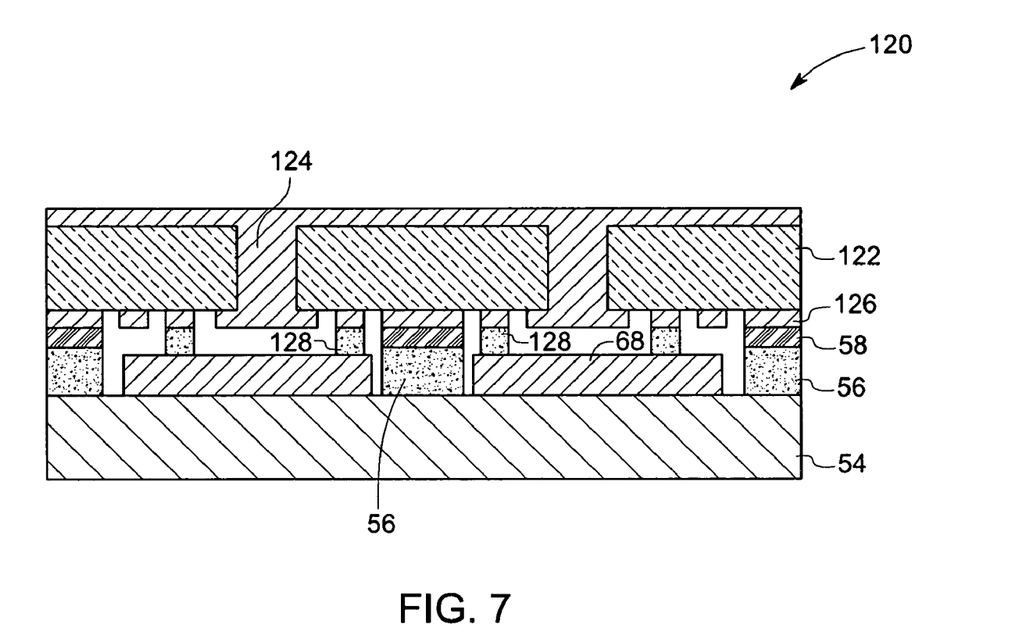
FIG. 7 is a diagrammatical illustration of an exemplary configuration of the thermal transfer device employed in the system of FIG. 1 in accordance with an embodiment of the present technique.

FIG. 7 is a diagrammatical illustration of an exemplary configuration 120 of the thermal transfer device 12 employed in the system of FIG. 1 in accordance with another embodiment of the present technique. In the illustrated embodiment, the bottom electrode 68 is formed by the process steps represented by reference numerals 52, 60, 64, and 66 described above with reference to FIGS. 4-6. As can be seen, the bottom tunneling electrode 68 is disposed on the bottom thermally conductive substrate 54. Further, the thermal transfer device 120 includes a thermal blocking layer 122 disposed generally adjacent or in proximity to the bottom tunneling electrode 68. In this exemplary embodiment, the thermal blocking layer 122 includes one or more of vias 124. Further, the thermal transfer device 120 includes a top tunneling electrode 126 disposed on the thermal blocking layer 122. The top tunneling electrode 126 includes a patterned metal layer and the one or more vias 124 are filled with metal for reducing electrical losses in the device 120. Further, the thermal transfer device 120 may include a plurality of support posts 128 disposed on the patterned metal layer 126 to facilitate the bonding of device 120 and to substantially prevent the top tunneling electrode 126 from bowing as well as maintaining the gap separation. In the illustrated embodiment, the support posts 128 include oxide posts.

Figure 8:
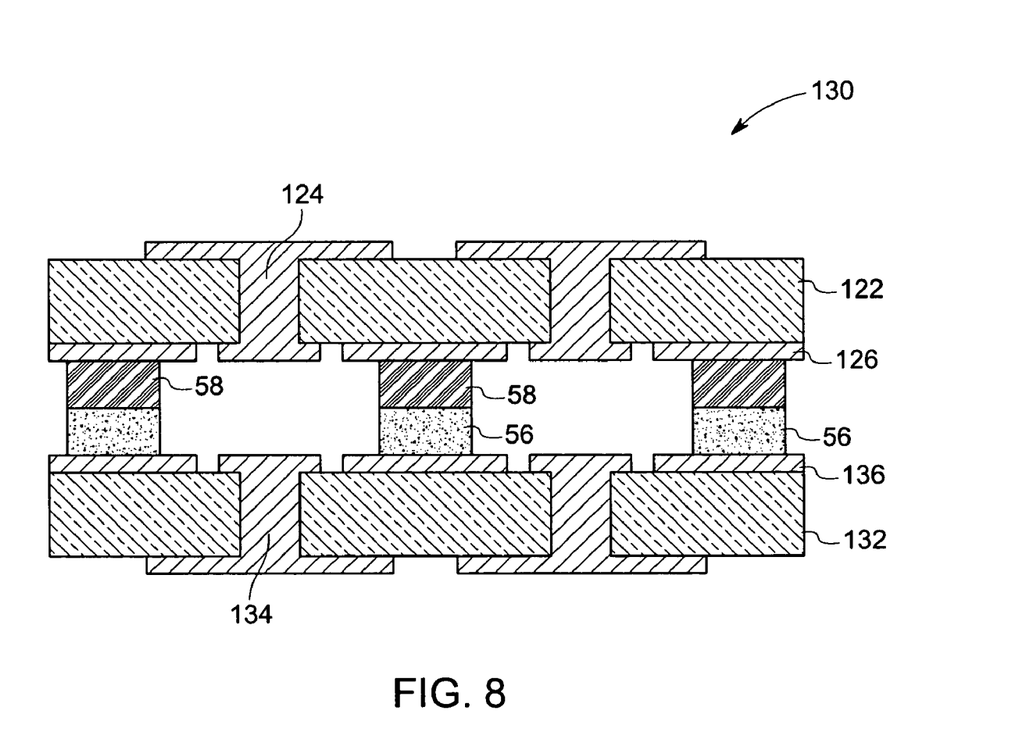
FIG. 8 is a diagrammatical illustration of an exemplary configuration of the thermal transfer device employed in the system of FIG. 1 in accordance with another embodiment of the present technique.

FIG. 8 is a diagrammatical illustration of another exemplary configuration 130 of the thermal transfer device 12 employed in the system of FIG. 1 in accordance with another embodiment of the present technique. In the illustrated embodiment, the thermal transfer device 130 includes the thermal blocking layer 122 having the one or more vias 124 and the metal layer forming the top tunneling electrode 126. Further, the metal layer extends through the one or more vias 124 for reducing the electrical losses in the thermal transfer device 130. Additionally, the thermal transfer device 130 includes a second thermal blocking layer 132 having one or more vias 134. In this embodiment, the bottom tunneling electrode is formed with a metal layer 136 disposed on the second thermal blocking layer 132. Again, the metal layer 136 extends through the one or more vias 134 for reducing the electrical losses. It should be noted that the top and bottom tunneling electrodes 126 and 136 are separated by the patterned electrical barrier 56 and the bonding material 58 between the electrodes 126 and 136.

Figure 9:
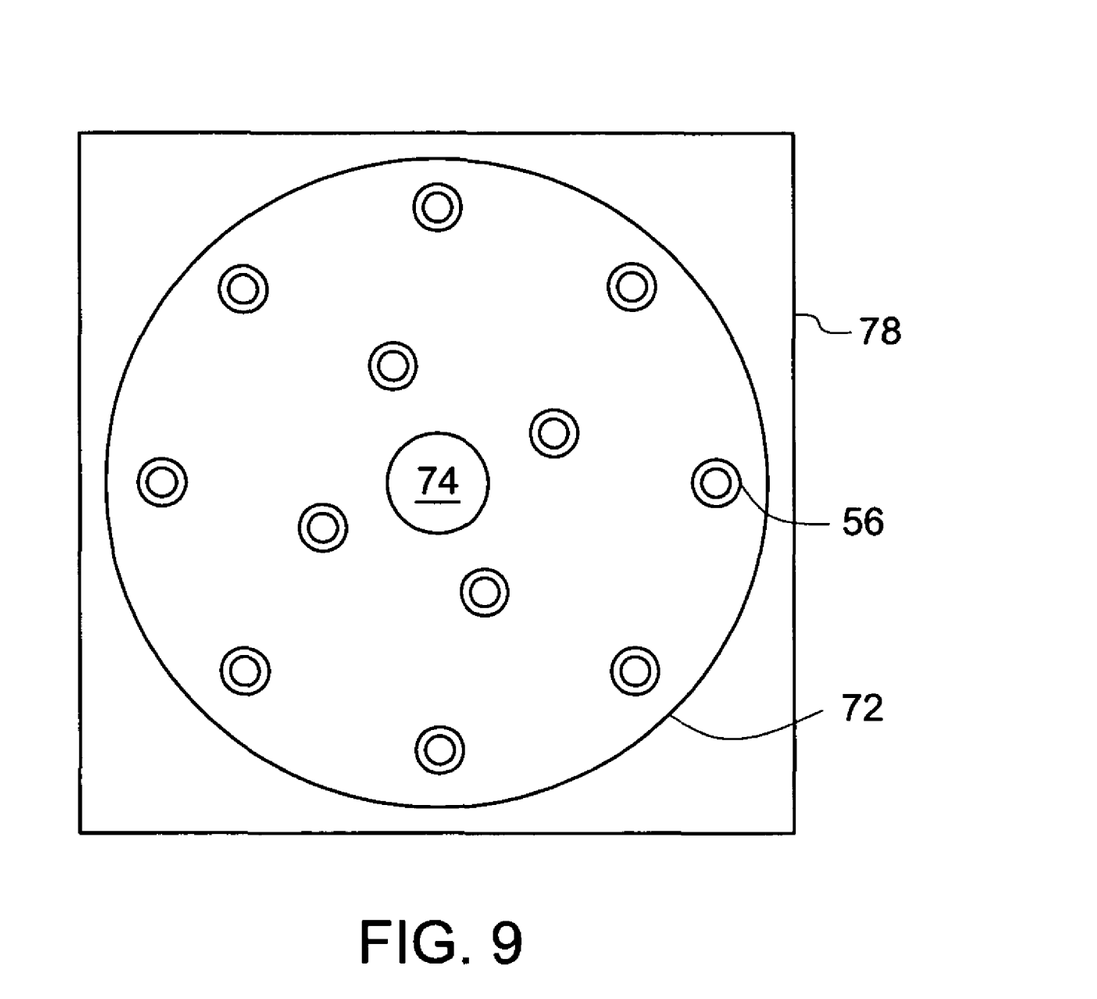
FIG. 9 is a diagrammatical illustration of an exemplary configuration of the thermal transfer device of FIG. 4 in accordance with an embodiment of the present technique.

FIG. 9 is a diagrammatical illustration of an exemplary configuration 140 of the thermal transfer device 85 of FIG. 4 in accordance with another embodiment of the present technique. The thermal transfer device 140 includes the plurality of oxide posts 56 disposed on the thermal blocking layer 72 on the thermally conductive substrate 78. The oxide posts 56 facilitate the thermotunneling gap control in the thermal transfer device 140. In certain embodiments, deposited films or combination of films that can be easily deposited and can be bonded to the thermal blocking layer 72 may be employed to facilitate the gap control.

Figure 10:
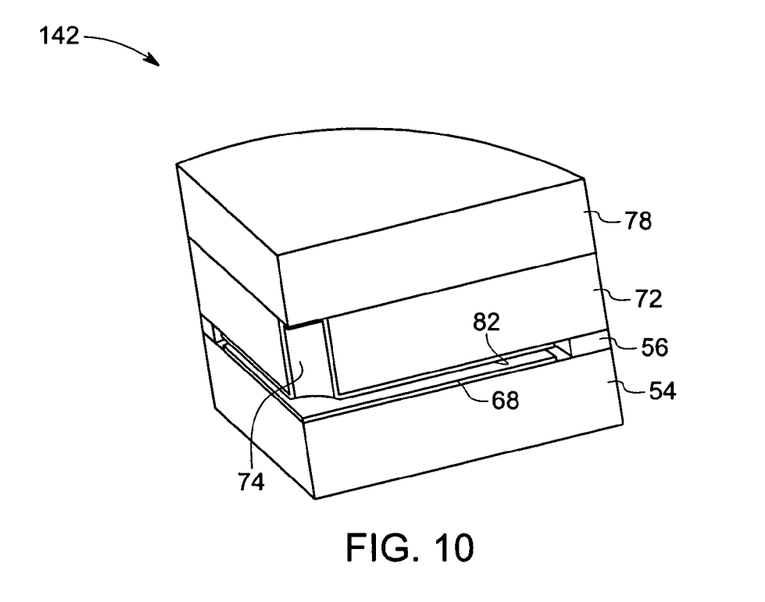
FIG. 10 is a perspective view of a quarter symmetry configuration of the thermal transfer device of FIG. 9 in accordance with an embodiment of the present technique.

FIG. 10 is a perspective view of a quarter symmetry configuration 142 of the thermal transfer device 140 of FIG. 9 in accordance with an embodiment of the present technique. As illustrated, the thermal transfer device 142 includes the top and bottom thermally conductive substrates 78 and 54 that are positioned opposite to one another. Further, the thermal blocking layer 72 is disposed between the top and bottom thermally conductive substrates 78 and 54 to reduce the thermal backpath in the thermal device 142. In addition, the top and bottom tunneling electrodes 82 and 68 are separated from one another between the top and bottom thermally conductive substrates 78 and 54 to define a tunneling path. The top tunneling electrode 82 is disposed on the thermal blocking layer 72 and the bottom tunneling electrode 68 is disposed on the bottom substrate 54. Advantageously, this configuration with one electrode 82 disposed on the thermal blocking layer 72 facilitates the use of support posts by etching out areas of the electrode 82 to at least substantially or entirely prevent tunneling through the posts 56. In the illustrated embodiment, the top and bottom tunneling electrodes 82 and 68 include platinum electrodes. Additionally, the thermal transfer device 142 may include the oxide insulator (not shown) and bonding layer disposed between the top and bottom substrates 78 and 54.

Figure 11:
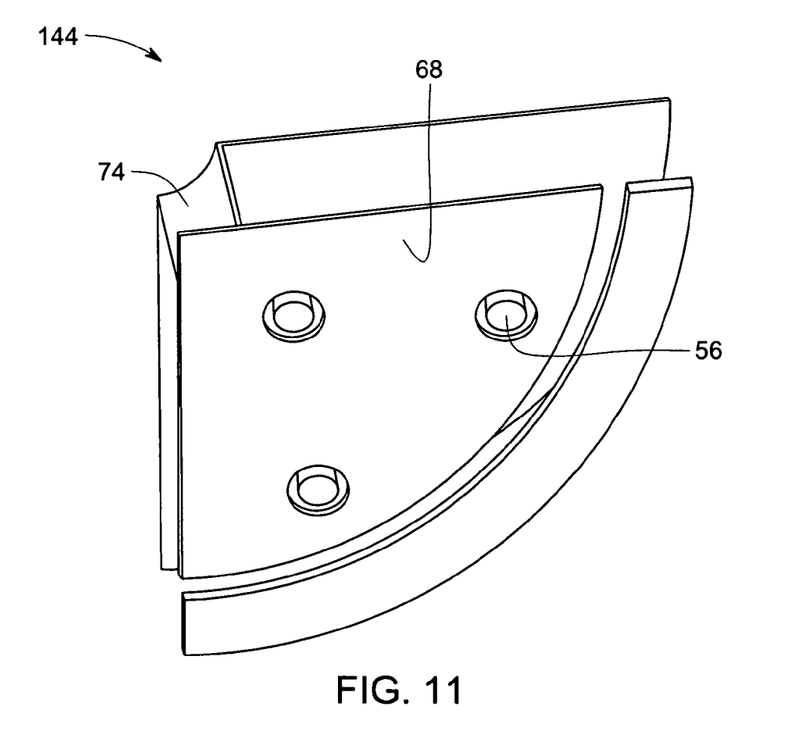
FIG. 11 is a sectional view of the quarter symmetry configuration of the thermal transfer device of FIG. 10 in accordance with an embodiment of the present technique.

FIG. 11 is a sectional view 144 of the quarter symmetry configuration 142 of the thermal transfer device of FIG. 10 in accordance with an embodiment of the present technique. As illustrated, the quarter symmetry configuration 142 includes three oxide posts 56 disposed between the top and bottom substrates 78 and 54. However, the number of the oxide posts 56 may be greater or lesser based upon a desired efficiency of the device 144. Furthermore, the location and size of such posts 56 may be selected for minimizing the bowing of the electrodes due to a pressure differential from inside to outside of the device 144 while providing the minimum thermal backpath in the device 144. In certain embodiments, the distance between the oxide posts 56 and the tunneling electrode 68 may also be controlled to minimize the thermal backpath in the device 144. It should be noted that the support posts 56 are isolated electrically from one of the electrodes such that preferential tunneling does not occur through the posts 56.

Figure 12:
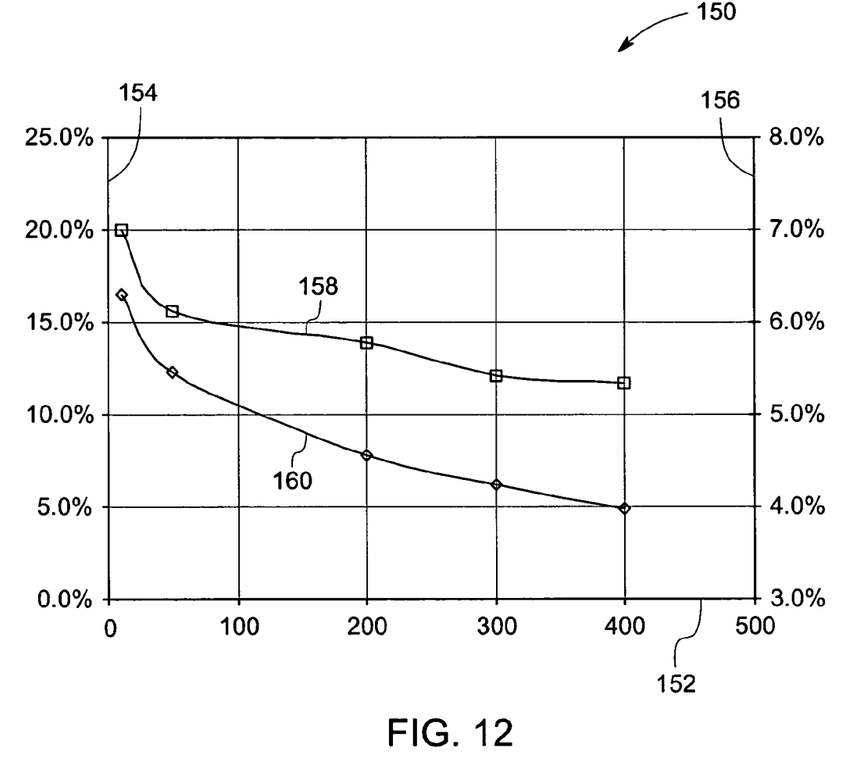
FIG. 12 is a graphical representation of exemplary results for back heat flow variation with space between oxide posts and electrodes in the thermal transfer device of FIG. 10 in accordance with an embodiment of the present technique.

FIG. 12 is a graphical representation of exemplary results 150 for back heat flow variation with space between oxide posts and electrodes in the thermal transfer device 144 of FIG. 11 in accordance with an embodiment of the present technique. In the illustrated embodiment, the abscissa axis 152 represents the space between the tunneling electrode 68 and the oxide post 56 in micrometers and the ordinate axis 154 represents the back heat flow (%) for an air forced convection with a heat sink. Further, the ordinate axis 156 represents the back heat flow (%) at boiling. The back heat flow for a convection coefficient of 500 W/m$^2$ K is represented by the profile 158 and the back heat flow for a convection coefficient of 5000 W/m$^2$ K is represented by the profile 160. As can be seen, as the space 152 between the oxide post 56 and the tunneling electrode 68 increases, the thermal parasitic losses of the thermal transfer device 144 due to the conduction heat transfer are reduced thereby enhancing the thermal performance of the thermal transfer device 144. Thus, the space between the between the oxide post 56 and the tunneling electrode 68 may be optimized to achieve a desired thermal performance of the thermal transfer device 144. In certain embodiments, the space between the oxide post 56 and the tunneling electrode 68 may be adjusted by patterning the oxide 56 using various semiconductor lithography and etching techniques.

Figure 13:
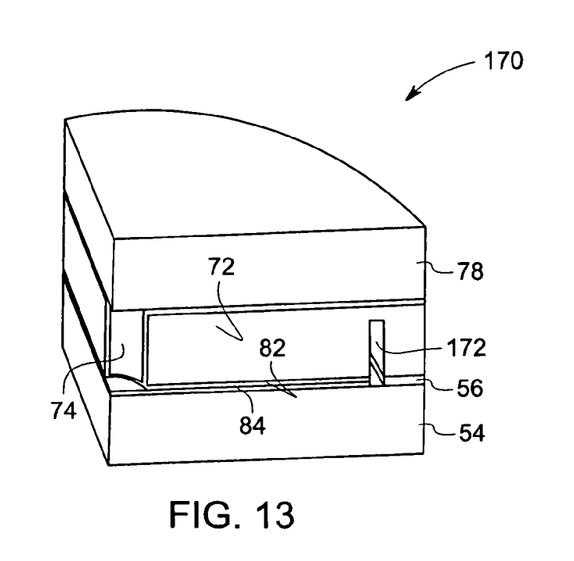
FIG. 13 is a perspective view of another quarter symmetry configuration of the thermal transfer device of FIG. 4 having a trench in accordance with an embodiment of the present technique.

The thermal performance of the thermal transfer devices described above may be further enhanced by selectively removing sections of the thermal blocking layer. FIG. 13 is a perspective view of another quarter symmetry configuration 170 of the thermal transfer device 84 of FIG. 4 having a single trench 172 in accordance with an embodiment of the present technique. As illustrated, the thermal transfer device 170 includes the trench 172 in the thermal blocking layer 72 to increase the thermal resistance in the back path stream. The trench 172 may be formed by using various techniques such as laser milling, machining, etching and so forth. In one embodiment, a plurality of trenches 172 may be formed in the thermal blocking layer 72 for enhancing the thermal resistance. In another embodiment, a width and height of the trenches 172 may be optimized to achieve a desired efficiency of the device 170.

Figure 14:
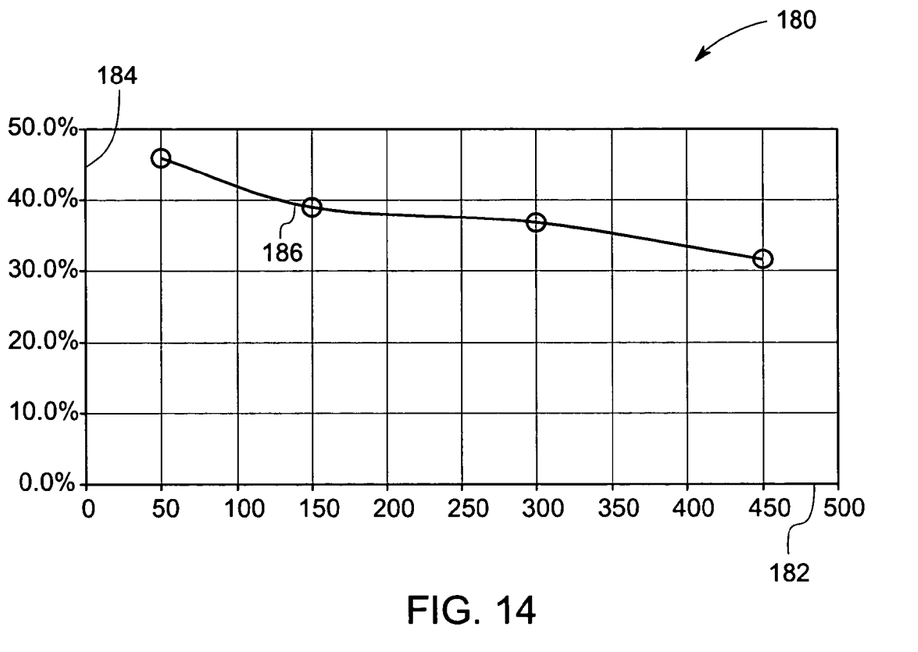
FIG. 14 is a graphical representation of exemplary results for back heat flow variation with trench height in the thermal transfer device of FIG. 11 in accordance with an embodiment of the present technique.

FIG. 14 is a graphical representation of exemplary results 186 for back heat flow variation 180 with trench height 182 in the thermal transfer device 170 of FIG. 13 in accordance with an embodiment of the present technique. In the illustrated embodiment, the abscissa axis represents the trench height (micrometers) 182 and the ordinate axis represents the back path heat flow (W) 184 in the thermal transfer device 170. As can be seen, the back path losses 186 reduce with an increase in the trench height 182. In this exemplary embodiment, by having a trench height 182 of about 450 μm the back path losses are reduced to about 29% as compared to the back path losses of about 45% for the trench height 182 of about 50 μm. Thus, the trench height 182 may be selected to substantially reduce the back path losses in the device 170. In certain embodiments, the width of the trench 172 may be optimized for reducing the back path losses in the device 170.

Figure 15:
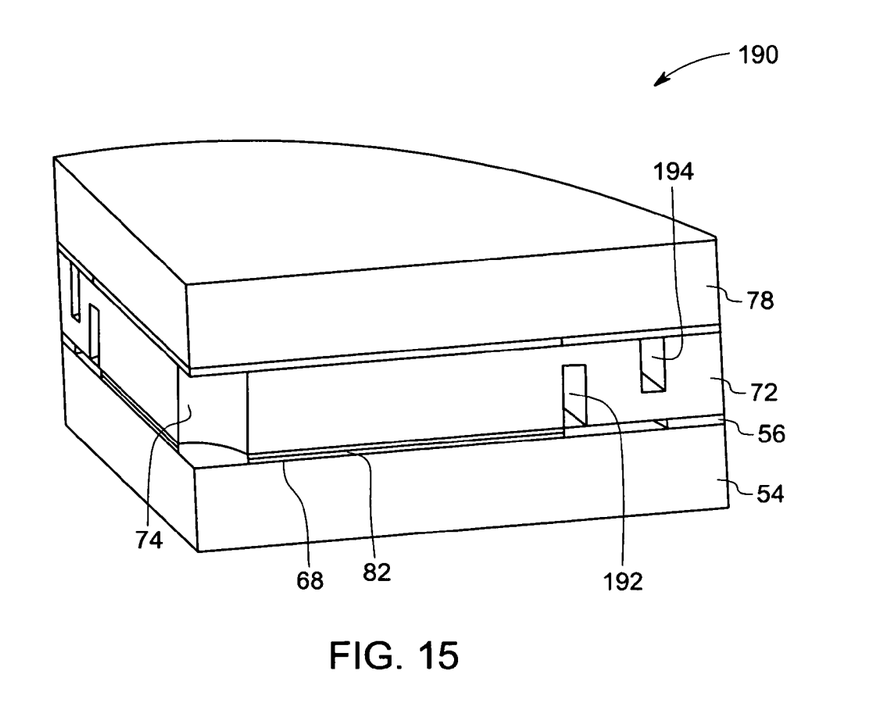
FIG. 15 is a perspective view of another quarter symmetry configuration of the thermal transfer device of FIG. 4 having multiple trenches in accordance with an embodiment of the present technique.

FIG. 15 is a perspective view of another quarter symmetry configuration 190 of the thermal transfer device 84 of FIG. 4 having multiple trenches in accordance with an embodiment of the present technique. In the illustrated embodiment, the thermal transfer device 190 includes trenches 192 and 194 formed in the thermal blocking layer 72. However, a greater number of trenches may be formed in the thermal blocking layer. In certain embodiments, the presence of multiple trenches such as 192 and 194 in the thermal blocking layer 72 substantially reduces the back path losses, thereby enhancing the efficiency of the thermal transfer device 190. Again, the depth and width of such trenches may be optimized to achieve a desired thermal performance.

The various aspects of the techniques described above find utility in a variety of heating/cooling systems, such as refrigeration, air conditioning, electronics cooling, industrial temperature control, power generation, and so forth. These include air conditioners, water coolers, refrigerators, heat sinks, climate control seats, and so forth. The thermal transfer devices as described above may be employed in refrigeration systems such as for household refrigeration and industrial refrigeration. In addition, such thermal transfer devices may be employed for cryogenic refrigeration, such as for liquefied natural gas (LNG) or superconducting devices. Further, the thermal transfer device may be employed in systems for ventilation and air conditioning. Examples of such systems include air conditioners and dehumidifiers. In addition, the thermal transfer devices may be employed for power generation and/or waste heat recovery in different applications by maintaining a thermal gradient between two electrodes. Examples of such applications include gas turbine exhausts, furnace exhausts, exhausts of vehicles, and so forth.

The thermal transfer device described above may also be employed for thermal energy conversion and for thermal management. It should be noted that the materials, device structure and the manufacturing techniques for the thermal transfer device may be selected based upon a desired thermal management need of an object. Such devices may be used for cooling of microelectronic systems such as microprocessor and integrated circuits. Further, the thermal transfer devices may be employed for thermal management of semiconductors, photonic devices, and infrared sensors. As noted above, the method described here may be advantageous in substantially reducing the back path heat losses in the thermal transfer device to meet the desired thermal management needs in the environments mentioned above.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system, comprising:
 a device, comprising:
 top and bottom thermally conductive substrates positioned opposite to one another, wherein a top surface of the bottom thermally conductive substrate is substantially atomically flat;
 a thermal blocking layer bordering the top thermally conductive substrate and disposed between the top and bottom thermally conductive substrates; and
 top and bottom electrodes separated from one another between the top and bottom thermally conductive substrates to define a tunneling gap, wherein the top electrode is disposed on the thermal blocking layer and the bottom electrode is disposed on the bottom thermally conductive substrate and wherein the tunneling gap is a vacuum;
 wherein the thermal blocking layer comprises one or more vias having an electrical feed through the thermal blocking layer between the top electrode and the top thermally conductive substrate.

2. The system of claim 1, comprising a patterned electrical barrier disposed between the top and bottom thermally conductive substrates.

3. The system of claim 2, wherein the patterned electrical barrier is disposed on the top thermally conductive substrate, or the bottom thermally conductive substrate, or a combination thereof.

4. The system of claim 2, wherein the patterned electrical barrier comprises an oxide, or a nitride, or a silica-based aerogel, or porous silicon, or glass or a polymer, or a combination thereof.

5. The system of claim 2, wherein the patterned electrical barrier comprises a plurality of support posts to substantially prevent bowing of at least one of the top and bottom electrodes due to a pressure differential from inside to outside of the device, or thermal stresses due to coefficient of thermal expansion.

6. The system of claim 2, comprising a wafer bondable layer disposed on the patterned electrical barrier, wherein the wafer bondable layer is bondable to the thermal blocking layer, or to a layer disposed on the thermal blocking layer.

7. The system of claim 6, wherein the wafer bondable layer comprises a diffusible bonding layer, or a direct bondable metal layer, or a solderable layer, or a eutectic layer disposed on the patterned electrical barrier.

8. The system of claim 1, comprising a diffusible bonding layer including polysilicon, or oxide, or silicon, or any combinations thereof, disposed on an electrical barrier layer between the top and bottom thermally conductive substrates.

9. The system of claim 1, comprising a direct bondable metal layer including copper, or gold, or any combinations thereof, disposed on an electrical barrier layer between the top and bottom thermally conductive substrates.

10. The system of claim 1, comprising a solderable layer or a eutectic layer including gold, or silicon, or tin, or any combinations thereof, disposed on an electrical barrier layer between the top and bottom thermally conductive substrates on the top thermally conductive substrate, or the bottom thermally conductive substrate, or a combination thereof.

11. The system of claim 1, wherein the thermal blocking layer has a coefficient of thermal expansion substantially equivalent to the coefficient of thermal expansion of the top and bottom electrodes.

12. The system of claim 1, wherein the thermal blocking layer comprises glass, or silicon dioxide, or sapphire, or porous silicon, or a combination thereof.

13. The system of claim 1, wherein the electrical feed comprises a metal layer.

14. The system of claim 1, wherein the top electrode, or the bottom electrode, or a combination thereof, comprises a patterned metal layer having one or more support posts that are at least electrically isolated from one of the electrodes.

15. The system of claim 1, further comprising a reflective coating disposed on the top and bottom electrodes to decrease the radiation losses in the device.

16. The system of claim 1, comprising one or more trenches disposed within the thermal blocking layer.

17. The system of claim 1, wherein introduction of current flow between the top and bottom thermally conductive substrates enables heat transfer between the top and bottom thermally conductive substrates via a flow of electrons through the tunneling gap.

18. The system of claim 1, wherein the device is configured to generate power by maintaining a temperature gradient between the top and bottom thermally conductive substrates.

19. The system of claim 1, comprising a refrigeration system having one or more of the device.

20. The system of claim 1, comprising a cooling system or an air conditioning system having one or more of the device.

21. The system of claim 1, comprising a thermal energy to electrical energy conversion system having one or more of the device.

22. The system of claim 1, comprising a microelectronic system having one or more of the device.

* * * * *

UNITED STATES PATENT AND TRADEMARK OFFICE
CERTIFICATE OF CORRECTION

| | |
|---|---|
| PATENT NO. | : 7,928,561 B2 |
| APPLICATION NO. | : 11/449002 |
| DATED | : April 19, 2011 |
| INVENTOR(S) | : Weaver et al. |

It is certified that error appears in the above-identified patent and that said Letters Patent is hereby corrected as shown below:

On the Title Pg, Item (73), under "Assignee", Line 1, delete "Nishayuna," and insert -- Niskayuna, --, therefor.

In Column 6, Lines 8-9, before "or a combination" delete "or silicon carbide,".

Signed and Sealed this
Nineteenth Day of July, 2011

David J. Kappos
*Director of the United States Patent and Trademark Office*